US009171591B2

(12) United States Patent
Lee et al.

(10) Patent No.: US 9,171,591 B2
(45) Date of Patent: Oct. 27, 2015

(54) CIRCUITS AND METHODS FOR EFFICIENT EXECUTION OF A READ OR A WRITE OPERATION

(71) Applicant: Oracle International Corporation, Redwood City, CA (US)

(72) Inventors: Jungyong Lee, San Jose, CA (US); Tsunghsun Hsieh, Santa Clara, CA (US); Chienan Lai, Fremont, CA (US)

(73) Assignee: Oracle International Corporation, Redwood City, CA (US)

( * ) Notice: Subject to any disclaimer, the term of this patent is extended or adjusted under 35 U.S.C. 154(b) by 248 days.

(21) Appl. No.: 13/905,057

(22) Filed: May 29, 2013

(65) Prior Publication Data

US 2014/0355358 A1    Dec. 4, 2014

(51) Int. Cl.
*G11C 7/00* (2006.01)
*G11C 7/10* (2006.01)

(52) U.S. Cl.
CPC ............ *G11C 7/1012* (2013.01); *G11C 7/1069* (2013.01); *G11C 7/1051* (2013.01)

(58) Field of Classification Search
CPC ... G11C 7/1006; G11C 7/1051; G11C 7/1078

USPC ............. 365/189.02, 189.15, 230.02, 230.08
See application file for complete search history.

(56) References Cited

U.S. PATENT DOCUMENTS

| 5,946,253 | A | * | 8/1999 | Fujiwara | ........................ 365/207 |
| 2010/0195415 | A1 | * | 8/2010 | Seko | ......................... 365/189.09 |

* cited by examiner

*Primary Examiner* — Connie Yoha
(74) *Attorney, Agent, or Firm* — Martine Penilla Group, LLP

(57) ABSTRACT

A system for efficient execution of a read or a write is described. The system includes a memory array including a way. The system further includes a read and compare circuit. The read and compare circuit compares data stored within lower address memory cells of the way with information received from a storage device to generate a result of comparison. Moreover, the read and compare circuit compares data stored within higher address memory cells of the way with the information to generate a result of comparison. The system further includes a merge and multiplex circuit coupled to the read and compare circuit. The merge and multiplex circuit merges the result of comparison generated based on the comparison with the lower address memory cells and the result of comparison generated based on the comparison with the higher address memory cells to create a merged outcome of comparison.

8 Claims, 10 Drawing Sheets

Read and Compare Circuit 130

Read and Compare Circuit 130

Write/no-op. when way selected

Write/no-op. when way not selected

Read op. when d_lft and d_rgt are inactive

Read op. when d_lft or d_rgt active

Reset op.

CIRCUITS AND METHODS FOR EFFICIENT EXECUTION OF A READ OR A WRITE OPERATION

BACKGROUND

A lot of devices include a processor, a memory controller, and a memory. For example, mobile devices, standalone devices, stationary devices, etc., include a combination of the processor, the memory controller, and the memory.

The memory controller receives a read command from the processor. The memory controller interprets the read command and provides a read signal to the memory to read data from the memory. The memory controller also receives a write command from the processor. The memory controller interprets the write command and provides a write signal to write data to the memory.

However, the reading and writing may not be performed efficiently, e.g., to save time, chip surface area, energy, costs, etc.

It is within this context that embodiments arise.

SUMMARY

Embodiments set forth in this disclosure provide circuits and methods for efficient execution of a read operation or a write operation. It should be appreciated that the present embodiments can be implemented in numerous ways, such as a process, an apparatus, a system, a device or a method on a computer-readable non-transitory medium. Several embodiments are described below.

In some embodiments, a system is provided for reading from or writing to a memory array. The system includes a combined read and compare circuit, and a combined merge, multiplex, and latch (MML) circuit. In some embodiments, an MML circuit is referred to herein as a data handling circuit. In several embodiments, the read and compare circuit is a pass-through circuit, e.g., lacks a latch, lacks storage, etc. For example, there is a lack of a latch between a read portion of the read and compare circuit and a compare portion of the read and compare circuit. The read portion is used to read data from the memory array and the compare portion is used to compare the read data with data stored in a flip-flop. In a number of embodiments, the latch converts a pulsed signal received from the flip-flop into a static signal to provide to a memory controller of the system.

Moreover, in various embodiments, there is a lack of a latch that couples a flip-flop to the read and compare circuit. The latch converts a pulsed signal received from the flip-flop into a static signal. The flip-flop stores the data that is to be compared with the data read from the memory array.

Furthermore, in some embodiments, there is a lack of a latch that couples a decoder to the MML circuit. The decoder decodes a signal indicating a selection of a way of the memory array for reading data from the way and the signal is provided by the decoder to the MML circuit. The latch converts a pulsed signal received from the decoder into a static signal.

In various embodiments, there is a lack of a latch that couples a no-read detector to the MML circuit. The no-read detector detects whether a read request or a no read request is received from a flip-flop. The latch converts a pulsed signal received from the no-read detector into a static signal.

The lack of use of the latches saves chip surface on a printed circuit board, saves energy consumed by the latches, saves time in developing the system for reading from or writing to the memory array, and saves costs associated with the latches. Each latch has a setup time and a hold time, both of which may be difficult to achieve. The lack of the latches avoids time, cost, and effort associated with meeting the setup time and the hold time. Furthermore, a clock signal is provided to the latches. The latches are distributed on an area of the printed circuit board and the distribution makes it easy to increase clock skew and makes it difficult to decrease the clock skew. When the clock skew increases, it becomes increasingly difficult to achieve the hold and setup times. Also, the latches increase a length of a path to the MML circuit, the read and compare circuit, etc. The increase in the length reduces speed of the MML circuit and the read and compare circuit. When the latches are not used, reduction in costs of use of the latches, increase in speed of the MML and read and compare circuits, decrease in time during use of the MML and read and compare circuits, and increase in chip surface area on the printed circuit board are achieved.

In various embodiments, a central timing control, e.g., a clock signal, etc., is used to control the MML and read and compare circuits. The central timing control saves time, effort, and costs associated with managing time associated with each latch to achieve the setup and hold times of each latch.

In a number of embodiments, the central timing control is used during a reset operation of resetting the MML circuit. The use of the central timing control for the reset operation helps achieve robustness against process variations in semiconductors of the memory array. For example, there is no delay during a falling edge of a signal output by the MML circuit.

In various embodiments, a system is described. The system includes a memory array including a way. The way includes lower address memory cells for storing data and including higher address memory cells for storing data. The lower address memory cells have lower addresses compared to addresses of the higher address memory cells. The system further includes a read and compare circuit coupled to the memory array. The read and compare circuit performs a read operation. The read operation includes reading the data stored within the lower address memory cells and for reading the data stored within the higher address memory cells. The read and compare circuit compares the data stored within the lower address memory cells with information received from a storage device to generate a result of comparison. Moreover, the read and compare circuit compares the data stored within the higher address memory cells with the information to generate a result of comparison. The system further includes a merge and multiplex circuit coupled to the read and compare circuit. The merge and multiplex circuit merges the result of comparison generated based on the comparison with the lower address memory cells and the result of comparison generated based on the comparison with the higher address memory cells to create a merged outcome of comparison. The merged outcome of comparison indicates whether the way has bits that match the information. The merge and multiplex circuit selects between providing the merged outcome of comparison during the read operation as an output and providing an indication of a selection of the way during a write operation as an output.

In some embodiments, a read and compare circuit is described. The read and compare circuit includes a first inverter for inverting a first signal to provide an inverted signal and a second inverter for inverting a second signal to provide an inverted signal. The second signal is opposite in magnitude to the first signal. The system further includes a first comparator coupled to the first inverter. The first comparator reads data from a bit line of a way of a memory array and compares the data read from the bit line with the inverted signal provided by the first inverter. The read and compare circuit includes a second comparator coupled to the second inverter. The second comparator reads data from an inverted bit line of the way and compares the data read from the inverted bit line with the inverted signal provided by the second inverter. The first and second comparators provide a result of the comparisons performed by the first and second comparators.

In several embodiments, a data handling circuit is described. The data handling circuit includes a merge circuit for merging a first result with a second result to generate a merged outcome. The first result is generated based on a comparison between bits stored within lower address memory cells of a way of a memory array and bits received from a storage device. The second result is generated based on a comparison between bits stored within higher address memory cells of the way of the memory array and the bits received from the storage device. The data handling circuit further includes a latch coupled to the merge circuit. The latch latches an inverted outcome generated from a portion of the merge circuit. The inverted outcome is used to generate the merged outcome. The data handling circuit includes a multiplexer having a portion that is integrated with the latch and having a portion that is integrated with the merge circuit. The multiplexer allows passage of an indication of a selection of the way during a write operation and for allowing passage of the merged outcome during a read operation.

Other aspects will become more apparent from the following detailed description, taken in conjunction with the accompanying drawings, illustrating by way of example the several embodiments.

DETAILED DESCRIPTION

The following embodiments relate to methods and systems for circuits and methods for efficient execution of a read operation or a write operation. It should be appreciated that several embodiments described in the present disclosure can be implemented in numerous ways, including as a process, an apparatus, a system, a device, or a method. Several exemplary embodiments will now be described in detail with reference to the accompanying drawings. In the following description, numerous specific details are set forth in order to provide a thorough understanding of various embodiments described in the present disclosure. It will be apparent, however, to one skilled in the art that a number of embodiments described in the present disclosure may be practiced without some or all of these specific details. In other instances, well known process operations have not been described in detail to avoid unnecessarily obscuring the present disclosure.

Figure 1:
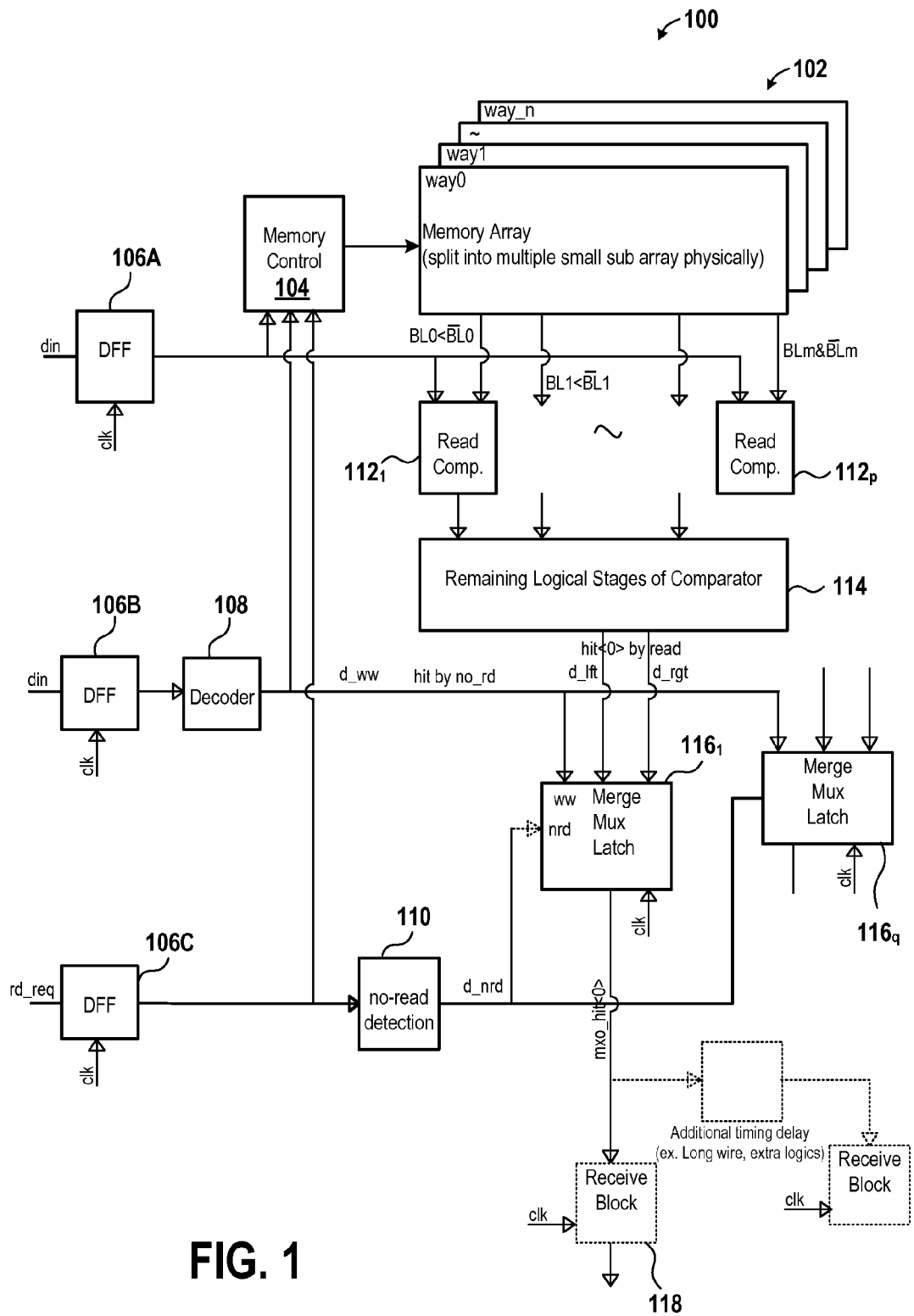
FIG. 1 is a block diagram of an embodiment of a system for writing data to and reading data from a memory array.

FIG. 1 is a block diagram of an embodiment of a system 100 for writing and reading data from a memory array 102. The memory array 102 includes a number of ways 0 thru n, where n is an integer greater than or equal to zero. Each way includes a number of memory cells and each memory cell stores a bit. For example, the way 0 includes 32, 64, or 128 memory cells. As another example, a memory cell is located in the way 0 between a bit line BL1 and a complement $\overline{BL1}$ of the bit line BL1, and another memory cell is located between and is coupled to a bit line BLm and a complement bit line $\overline{BLm}$, which is an inverse of the bit line BLm, where m is an integer greater than zero. The bit line bar $\overline{BLm}$ is complementary, e.g., opposite of, has an opposite value, has an inverted value, etc., to the bit line BLm. Examples of the memory array 102 include a dynamic random access memory (DRAM) and a static RAM (SRAM).

The system 100 includes the memory array 102, a memory controller 104, a flip-flop 106A, a flip-flop 106B, a flip-flop 106C, a decoder 108, a no-read detector 110, and a set of read and compare circuits $112_1$ thru $112_p$, where p is an integer greater than zero. The system 100 further includes a remaining logical stages of comparator block 114, a set of merge, multiplexer, and latch (MML) blocks $116_1$ thru $116_q$, and a receive storage block 118, where q is an integer greater than zero.

In various embodiments, a flip-flop is sometimes referred to herein as a storage device.

In some embodiments, the remaining logical stages of comparator block 114 are a part of the read and compare circuits $112_1$ thru $112_p$. For example, any function described herein as being performed by the remaining logical stages of comparator block 114 is performed by one or more of the read and compare circuits $112_1$ thru $112_p$.

The flip-flop 106A is coupled to the memory controller 104 and to the read and compare circuits $112_1$ thru $112_p$. The flip-flop 106B is coupled to the decoder 108 and the flip-flop 106C is coupled to the no-read detector 110. The memory controller 104 is coupled to the memory array 102. The set of read and compare circuits $112_1$ thru $112_p$ is coupled to the way 0. Similarly, additional multiple sets of read and compare circuits (not shown), similar to the set of read and compare circuits $112_1$ thru $112_p$, are coupled to the ways 1 thru n, where n is an integer greater than or equal to one. The remaining logical stages of comparator 114 is coupled to the set of the read and compare circuits $112_1$ thru $112_p$. Similarly, additional remaining logical stages of comparator (not shown) are coupled to the additional multiple sets of read and compare circuits (not shown). The MML block $116_1$ is coupled to the remaining logical stages of comparator 114 and the receive storage block 118 is coupled to the MML block $116_1$. Similarly, the MML block $116_q$ is coupled to one of the additional remaining logical stages of comparator (not shown). The decoder 108 is coupled to the MML blocks $116_1$ thru $116_s$. In some embodiments, the decoder 108 is directly coupled to each of the MML blocks $116_1$ to $116_q$. For example, there is a lack of existence of a latch coupled between the decoder 108 and the MML blocks $116_1$ to $116_q$.

Also, the no-read detector 110 is coupled to the MML blocks $116_1$ thru $116_q$. In some embodiments, the no-read detector 110 is directly coupled to the MML blocks $116_1$ thru $116_q$. For example, there is a lack of a latch that couples the no-read detector 110 to the MML blocks $116_1$ to $116_q$.

It should be noted that although each flip-flop 106A, 106B, and 106C is shown as a D flip-flop in FIG. 1, in some embodiments, a JK flip-flop may be used instead.

In some embodiments, the system 100 excludes the remaining logical stages of comparator block 114 and the read and compare circuits $112_1$ thru $112_p$ are coupled to the MML block 1161.

In various embodiments, the system 100 includes any number of ways, any number of read and compare circuits, any number of remaining logical stages of comparator block, any number of MML blocks, and any number of receive storage blocks.

Read Operation

During a read operation, a write way signal (wr_way) is inactive, e.g., off, low, zero, etc., and is stored in the flip-flop 106B. Moreover, during the read operation, a read request signal (rd_req) is active, e.g., on, high, 1, etc., and is stored within the flip-flop 106C. The flip-flop 106C passes the read request signal to the no-read detector 110 and to the memory controller 104. The memory controller 104 sends the read request signal to the ways 0 thru n to activate the ways 0 thru n for reading. A data in (din) signal is stored in the flip-flop 106A and sent by the flip-flop 106A to the read and compare circuits $112_1$ thru $112_p$. In some embodiments, the data in signal is referred to herein as information. The read and compare circuits $112_1$ thru $112_p$ also sense, e.g., read, access, etc., bits stored within the way 0.

Also, the read and compare circuits $112_1$ thru $112_p$ and the remaining logic stages of comparator block 114 compare the bits sensed with the bits received from the flip-flop 106A to determine a result of comparison. For example, when there is a match between the bits of the data in signal and bits read from lower address memory cells of the memory array 102, a portion of the read and compare circuits $112_1$ thru $112_p$ that performs the comparison provides an active signal, e.g., 1, etc., as a result of the comparison. As another example, when there is a match between the bits of the data in signal and bits read from higher address memory cells of the memory array 102, a portion of the read and compare circuits $112_1$ thru $112_p$ that performs the comparison provides an active signal, e.g., 1, etc., as a result of the comparison. As yet another example, when there is a lack of match between the bits of the data in signal and bits read from the lower address memory cells of the memory array 102, a portion of the read and compare circuits $112_1$ thru $112_p$ that performs the comparison provides an inactive signal, e.g., 0, etc., as a result of the comparison.

As another example, when there is a lack of match between the bits of the data in signal and bits read from the higher address memory cells of the memory array 102, a portion of the read and compare circuits $112_1$ thru $112_p$ that performs the comparison provides an inactive signal, e.g., 0, etc., as a result of the comparison. The lower and higher address memory cells are further described below.

The result of comparison generated for the lower address bits is received as a signal indicated as d_lft received by the MML block $116_1$ in the FIG. 1 and the result of comparison generated for the higher address bits is received as a signal indicated as d_rgt received by MML block $116_1$ the FIG. 1. In some embodiments, d_lft is referred to herein as a result of comparison achieved by comparing bits stored within the higher address memory cells with bits of the data in signal. In various embodiments, d_rgt is referred to herein as a result of comparison achieved by comparing bits stored within the lower address memory cells with bits of the data in signal.

The lower address memory cells have a lower address within the way 0 than that of the higher address memory cells within the way 0. The way 0 is split into lower and higher address memory cells when the way 0 is large, e.g., exceeds a certain bit size.

In various embodiments, a way of the memory array 102 is divided into any number of sets of addressed memory cells. For example, the way 0 is divided into three separate groups of addressed memory cells. One of the three separate groups includes the higher address memory cells, another one of the three separate groups includes the lower address memory cells, and yet another one of the three separate groups includes yet lower address memory cells. The yet lower address memory cells have lower addresses than that of the lower address memory cells.

In some embodiments, a comparator includes logic AND gates that perform an AND operation between a bit received from the flip-flop 106A with a bit received from a way.

The MML block $116_1$ merges a result of comparison generated for lower address bits within lower address memory cells of the way 0 with higher address bits of higher address memory cells of the way 0 to generate a merged outcome of comparison. For example, when the lower address memory cells or the higher address memory cells includes bits that matches the bits of the data in signal, the merged outcome of comparison is that the way 0 includes bits that match those in the data in signal. As another example, when the lower address memory cells and the higher address memory cells include bits that do not match bits received in the data in signal, the merged outcome of comparison is that the way 0 does not include bits that match those in the data in signal. The merged outcome of comparison includes whether the higher address memory cells or the lower address memory cells include bits that match bits received within the data in signal. In various embodiments, the MML block $116_1$ includes one or more logic OR gates that perform a logic OR operation between a result of comparison received by comparing the lower address bits with the data in signal and a result of comparison received by comparing the higher address bits with the data in signal.

When the read request signal is active, the no-read detector 110 generates an inactive no-read detect signal. The no-read detect signal is indicated as "d_nrd" in FIG. 1. The MML block $116_1$ receives the inactive no-read detect signal, e.g., a read detect signal, etc., from the no-read detector 110 during the read operation and upon receiving the inactive no-read detect signal, allows passage of the merged outcome of comparison to the receive storage block 118. The receive storage block 118 may be accessed by a processor (not shown) to receive information regarding whether the way 0 includes bits that are received in the data in signal.

Write Operation

During a write operation, the read request signal stored within the flip-flop 106C is inactive and the write way signal stored within the flip-flop 106B is active. The write way signal is sent by the flip-flop 106B to the decoder 108 and is decoded by the decoder 108 to send the write way signal to the memory controller 104 and to the MML blocks $116_1$ thru $116_q$.

In some embodiments, the decoder 108 is a demultiplexer that demultiplexes the write way signal received from the flip-flop 106B into multiple write way signals and sends each write way signal to a corresponding MML block $116_1$, or $116_2$, or $116_q$. For example, the decoder 108 decodes the write way signal received from the flip-flop 106B to generate a decoded signal, e.g., the write way signal, etc., and sends the write way signal to the MML block $116_1$ and sends the write way signal to the MML block $116_q$.

It should be noted that the write way signal output as a decoded signal from the decoder 108 is indicated as a d_ww signal in FIG. 1. The active write way signal indicates that a way, e.g., the way 0, etc., to which the active write way signal is sent via the memory controller 104 is selected to write data to the way. The memory controller 104 receives the write way signal. Upon receiving the write way signal that is active, the memory controller 104 writes data to the way 0. The way 0 is activated by the memory controller 104 to be written upon receiving the write way signal. Also, the data in signal is received during the write operation from the flip-flop 106A by the memory controller 104. The memory controller 104 writes bits of the data in signal to the way 0 that is activated. The read and compare circuits $112_1$ thru $112_p$ and the remaining logical stages of comparator block 114 are inactive during the write operation. The inactive read request signal is received by the no-read detector 110 to generate an active no-read detect signal.

Upon reception of the active no-read detect signal from the no-read detector 110 during the write operation, the MML block $116_1$ selects an indication of selection of the way 0 received from the decoder 108 and sends the indication to the receive storage block 118. The processor accesses the receive storage block 118 to receive information about the indication of the selection of the way to which data is written.

Figure 2A:
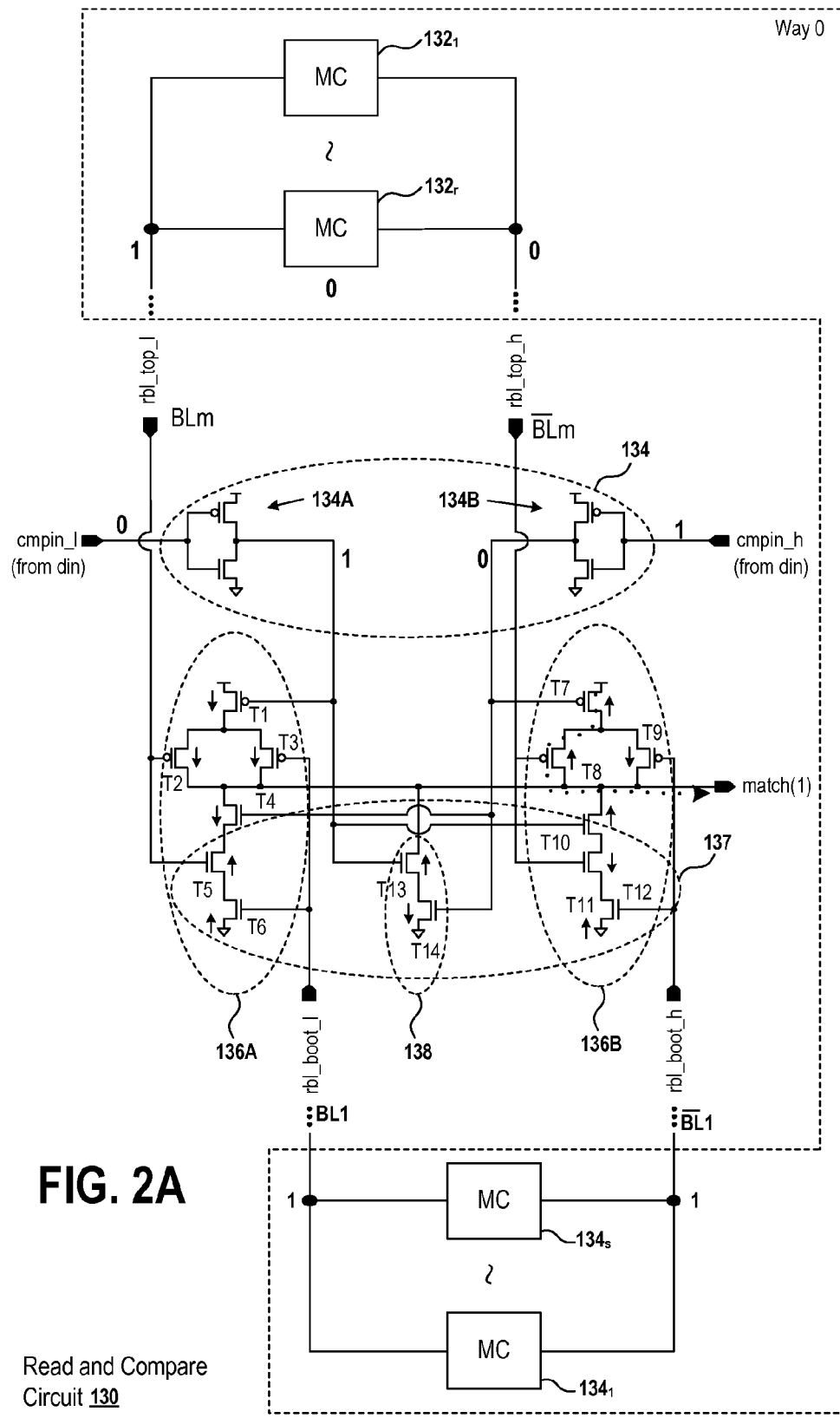
FIG. 2A is a diagram illustrating use of an embodiment of a read and compare circuit of the system of FIG. 1 when a memory cell of the memory array stores a bit 0.

FIG. 2A is a diagram illustrating use of an embodiment of a read and compare circuit 130, which is an example of any of the read and compare circuits $112_1$ thru $112_p$ (FIG. 1), when a memory cell $132_r$ of the memory array 102 (FIG. 1) stores a bit 0. As shown, the read and compare circuit 130 includes memory cells $132_1$, $132_r$, $134_1$, $134_s$ within the way 0, where r is an integer greater than zero, and s is an integer greater than zero. The memory cell $132_r$ stores a bit 0. When the bit 0 is stored within the memory cell $132_r$, the bit line BLm has a high value of 1 and the bit line $\overline{BLm}$ has a low value of 0. It should be noted that the bit line BLm is indicated as rbl_top_l and the bit line $\overline{BLm}$ is indicated as rbl_top_h in FIGS. 2A and 2B.

Continuing with FIG. 2A, inverters 134, which includes an inverter 134A and another inverter 134B, are coupled to the flip-flop 106A (FIG. 1). For example, an input compare in low (cmpin_l) of the inverter 134A is coupled to an output of the flip-flop 106A and an input compare in high (cmpin_h) of the inverter 134B is coupled to output of the flip-flop 106B via an inverter (not shown). As another example, when a bit stored and received from the flip-flop 106A has a low value, e.g., zero, etc., the compare in high input has a high value, e.g., active, one, on, etc., and the compare in low input has a low value, e.g., inactive, zero, off, etc. As yet another example, when a bit stored and received from the flip-flop 106A has a high value, e.g., one, etc., the compare in high input has a low value, e.g., inactive, zero, off, etc., and the compare in low input has a high value, e.g., active, one, on, etc.

The input compare in high is complementary to the input compare in low (cmpin_l). For example, when the input compare in high has a high value, the input compare in low has a low value.

A comparator and pull-down transistor circuit 136A is coupled to the bit line BLm and a comparator and pull-down transistor circuit 136B is coupled to the bit line bar $\overline{BLm}$. A pull-down transistor circuit 138 is connected to pull-down transistor circuits 136A and 136B, and to outputs of the inverters 134A and 134B. The comparator and pull-down transistor circuit 136A includes pull-down transistors T1, T2, T3, T4, T5, and T6. Moreover, the comparator and pull-down transistor circuit 136B includes pull-down transistors T7, T8, T9, T10, T11, and T12. Also, the pull-down transistor circuit 138 includes pull-down transistors T13 and T14.

It should be noted that the transistors T1, T2, and T3 are parts of a comparator circuit of the comparator and pull-down transistor circuit 136A. Similarly, the transistors T7, T8, and T9 are parts of a comparator circuit of the comparator and pull-down transistor circuit 136B. Moreover, the transistors T4, T5, and T6 are parts of a pull-down transistor circuit of the comparator and pull-down transistor circuit 136A. Similarly, the transistors T10, T11, and T12 are parts of a pull-down transistor circuit of the comparator and pull-down transistor circuit 136B.

The pull-down transistors T4, T5, and T6 are coupled to the transistors T1, T2, and T3 of the comparator circuit. Similarly, the pull-down transistors T10, T11, and T12 are coupled to the transistors T7, T8, and T9 of the comparator circuit.

The comparator and pull-down transistor circuit 136A is coupled to the inverter 134A. For example, the transistor T1 is coupled to an output of the inverter 134A. Similarly, the comparator and pull-down transistor circuit 136B is coupled to the inverter 134B. For example, the transistor T7 is coupled to an output of the inverter 134B.

Values of any remaining memory cells, e.g., the memory cells $132_1$, $134_1$, $134_s$, etc., within the way 0 are ignored when the memory cell $132_r$ is read. For example, a value of a bit line BL1 is held to be high, e.g., one, etc., and a value of a bit line $\overline{BL1}$ is also held to be high. The inverter 134A inverts a low value, e.g., inactive value, zero, etc., received at the input compare in low to provide a high value, e.g., active value, inverted signal, one, etc., as an output. The transistor T13 is on, e.g., active, operational, etc., upon receiving the high value from the output of the inverter 134A.

Similarly, the inverter 134B inverts a high value, e.g., active value, one, etc., received at the input compare in high to provide a low value, e.g., inactive value, zero, inverted signal, etc., as an output. The low value provided by the inverter 134B is opposite in magnitude to the high value provided by the inverter 134A. For example, the low value has a magnitude of zero and the high value has a magnitude of one. As another example, the low value has a low magnitude and the high value has a magnitude higher than the low magnitude. The transistor T14 is off, e.g., inactive, inoperational, etc., upon receiving the low value from the output of the inverter 134B.

Figure 2B:
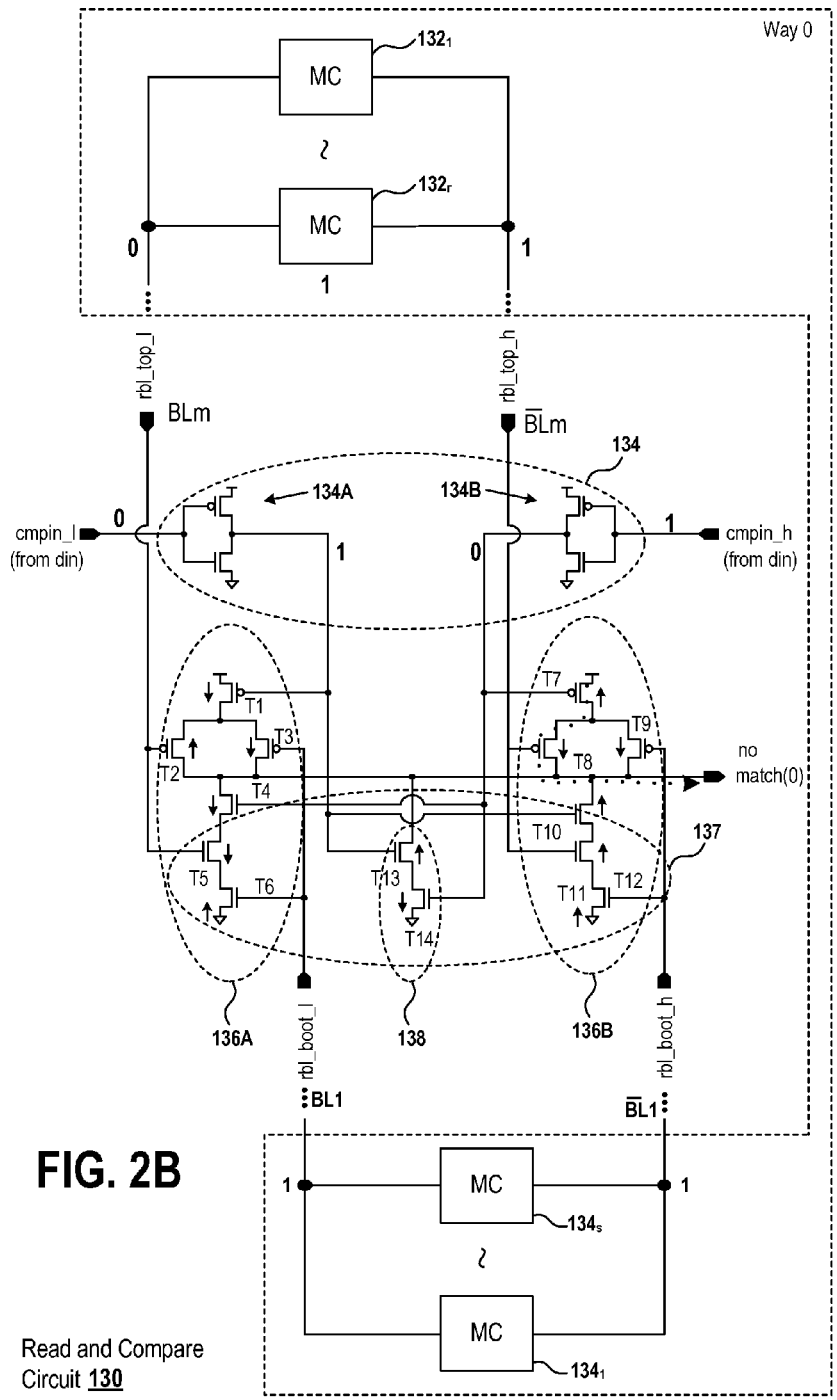
FIG. 2B is a diagram illustrating use of an embodiment of the read and compare circuit when the memory cell stores a bit 1 instead of a bit 0.

An on operation of a transistor is indicated by an up arrow in the FIG. 2A and an off operation of a transistor is indicated by a down arrow in FIGS. 2A and 2B.

Continuing with FIG. 2A, the transistor T1 is off upon receiving the high value from the output of the inverter 134A.

Also, the transistor T2 is off upon receiving the high value from the bit line BLm and the transistor T3 is off upon receiving the high value from the bit line BL1. The transistors T1 and T2 compare data, e.g., the high value, etc., received from the bit line BLm with an inverted signal, e.g., the high value, etc., received from the output of the inverter 134A.

Moreover, the transistor T4 is off upon receiving the low value from the output of the inverter 134B and the transistor T5 is on upon receiving the high value of the bit line BLm. The transistor T6 is on upon receiving the high value of the bit line BL1. A current does not flow from the transistors T1, T2, and T3 that are off to a match output of the read and compare circuit 130.

The transistor T7 is on upon receiving the low value from the output of the inverter 134B. Also, the transistor T8 is on upon receiving the low value from the bit line bar $\overline{BLm}$ and the transistor T9 is off upon receiving the high value from the bit line $\overline{BL1}$. The transistors T7 and T8 compare data, e.g., the low value, etc., received from the bit line $\overline{BLm}$ with an inverted signal, e.g., the low value, etc., received from the output of the inverter 134B. When the transistor T2 is off and the transistor T8 is on, the transistors T2 and T8 sense that a bit 0 is stored within the memory cell $132r$.

Moreover, the transistor T10 is on upon receiving the high value from the output of the inverter 134A and the transistor T11 is off upon receiving the low value of the bit line bar $\overline{BLm}$. The transistor T12 is on upon receiving the high value of the bit line $\overline{BL1}$. A current flows from the transistors T7, T8, and T9 that are on to the match output of the read and compare circuit 130 to indicate a match between the bit stored in the memory cell $132r$ and a bit, e.g., a bit 0, etc., of the data input signal that is provided by an output of the flip-flop 106A (FIG. 1). The match indicated is an example of a result of comparison performed by the comparator and pull-down transistor circuits 136A and 136B.

FIG. 2B is a diagram illustration use of the read and compare circuit 130 when the memory cell $132_r$ stores a bit 1 instead of a bit 0. The inverters 134A, 134B, and the pull-down transistors T13 and T14 function the same as that described above with respect to FIG. 2A.

The transistor T1 is off upon receiving the high value from the output of the inverter 134A. Also, the transistor T2 is on upon receiving the low value from the bit line BLm and the transistor T3 is off upon receiving the high value from the bit line BL1. The transistors T1 and T2 compare data, e.g., the low value, etc., received from the bit line BLm with an inverted signal, e.g., the high value, etc., received from the output of the inverter 134A. Moreover, the transistor T4 is off upon receiving the low value from the output of the inverter 134B and the transistor T5 is off upon receiving the low value of the bit line BLm. The transistor T6 is on upon receiving the high value of the bit line BL1. A current does not flow from the transistors T1, T2, and T3 when the transistors T1 and T3 are off to the match output of the read and compare circuit 130.

The transistor T7 is on upon receiving the low value from the output of the inverter 134B. Also, the transistor T8 is off upon receiving the high value from the bit line bar $\overline{BLm}$ and the transistor T9 is off upon receiving the high value from the bit line BL1. The transistors T7 and T8 compare data, e.g., the high value, etc., received from the bit line $\overline{BLm}$ with an inverted signal, e.g., the low value, etc., received from the output of the inverter 134B. When the transistor T2 is on and the transistor T8 is off, the transistors T2 and T8 sense that a bit 1 is stored within the memory cell $132_r$.

Moreover, the transistor T10 is on upon receiving the high value from the output of the inverter 134A and the transistor T11 is on upon receiving the high value of the bit line bar $\overline{BLm}$. The transistor T12 is on upon receiving the high value of the bit line $\overline{BL1}$. A current does not from the transistors T7, T8, and T9 to the match output (match) of the read and compare circuit 130 to indicate a lack of a match between the bit 1 stored in the memory cell $132_r$ and a bit, e.g., a bit 0, etc., of the data input signal that is provided by an output of the flip-flop 106A (FIG. 1). The lack of the match indicated is an example of a result of comparison performed by the comparator and pull-down transistor circuits 136A and 136B.

In various embodiments, instead of P-channel metal oxide semiconductor field effect transistors (PMOS transistors) and N-channel metal oxide semiconductor field effect transistors (NMOS) shown in FIGS. 2A and 2B, any other type of transistors, e.g., bipolar junction transistors, etc., may be used in the read and compare circuit 130.

In some embodiments, the read and compare circuit 130 is a pass-through circuit. For example, the read and compare circuit 130 lacks a latch. As another example, a bit read from the memory array 102 does not pass through a latch to be received by the comparator circuits of the read and compare circuit 130. As yet another example, the read and compare circuit 130 lacks storage of a bit.

In various embodiments, inverters 134A and 134B help reduce leakage current by working as a virtual switch.

In some embodiments, the pull-down transistors T4, T5, T6, T10, T11, T12, T13, and T14 of a pull-down circuit 137 work together to pull down the match output. In these embodiments, small transistors T4, T5, T6, T10, T11, T12, T13, and T14 may be used to increase a speed of the read and compare circuit 130.

Figure 3:
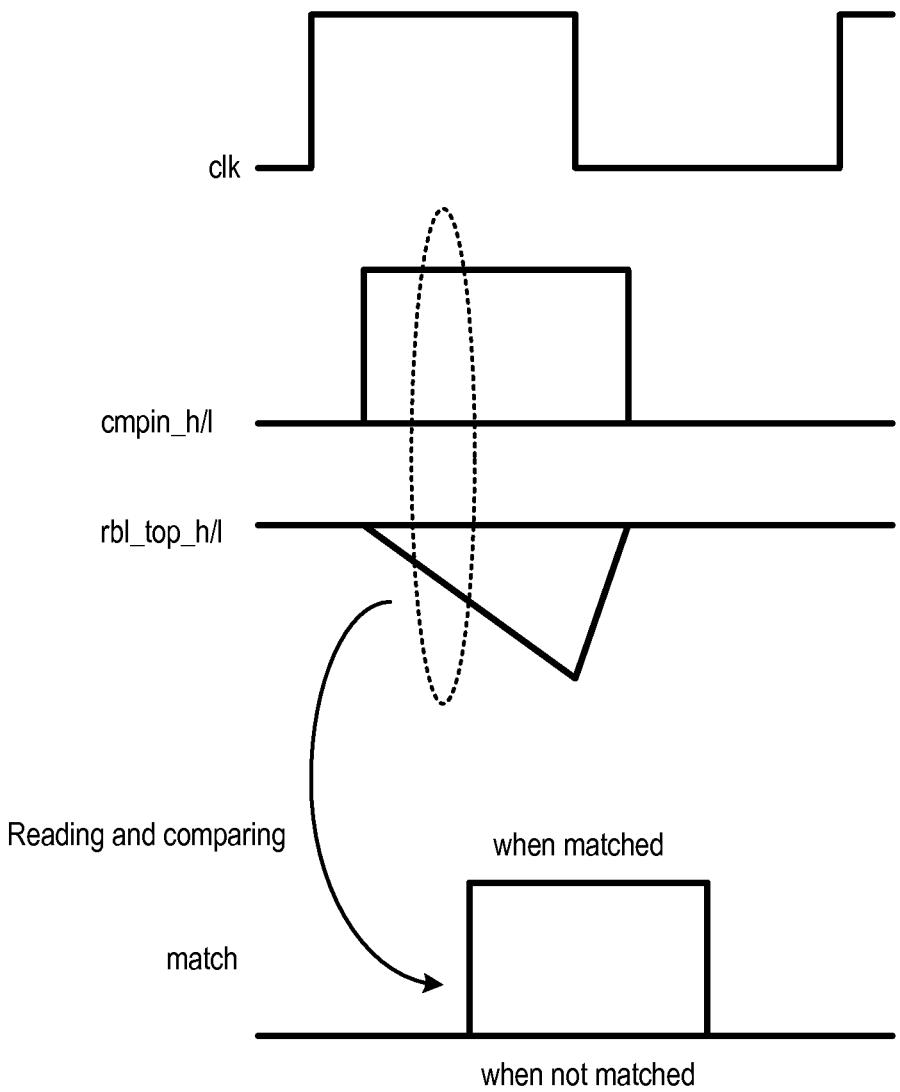
FIG. 3 is a timing diagram illustrating use of an embodiment of the read and compare circuit to determine whether there is match or a lack of match between a bit stored in the memory cell and a bit received from an output of a flip-flop.

FIG. 3 is a timing diagram illustrating a use of the read and compare circuit 130 (FIGS. 2A and 2B) to determine whether there is match or a lack of match between a bit stored in the memory cell $132_r$ and a bit received from an output of the flip-flop 106A (FIG. 1). A clock signal clk is supplied to the flip-flops 106A, 106B, and 106C to store bits that are provided as inputs to the flip-flops 106A, 106B, and 106C. After a rising edge of the clock signal clk, when there is a match between a signal on the bit line rbl_top_h and a signal at the input compare in low of the inverter 134A (FIGS. 2A and 2B) and there is a match between a signal on the bit line rbl_top_l and a signal at the input compare in high of the inverter 134B (FIGS. 2A and 2B), the output of the read and compare circuit 130 indicates the match. On the other hand, after a rising edge of the clock signal clk, when there is a lack of a match between a signal on the bit line rbl_top_h and a signal at the input compare in low of the inverter 134A (FIGS. 2A and 2B) and there is a lack of a match between a signal on the bit line rbl_top_l and a signal at the input compare in high of the inverter 134B (FIGS. 2A and 2B), the output of the read and compare circuit 130 indicates the lack of match.

Figure 4A:
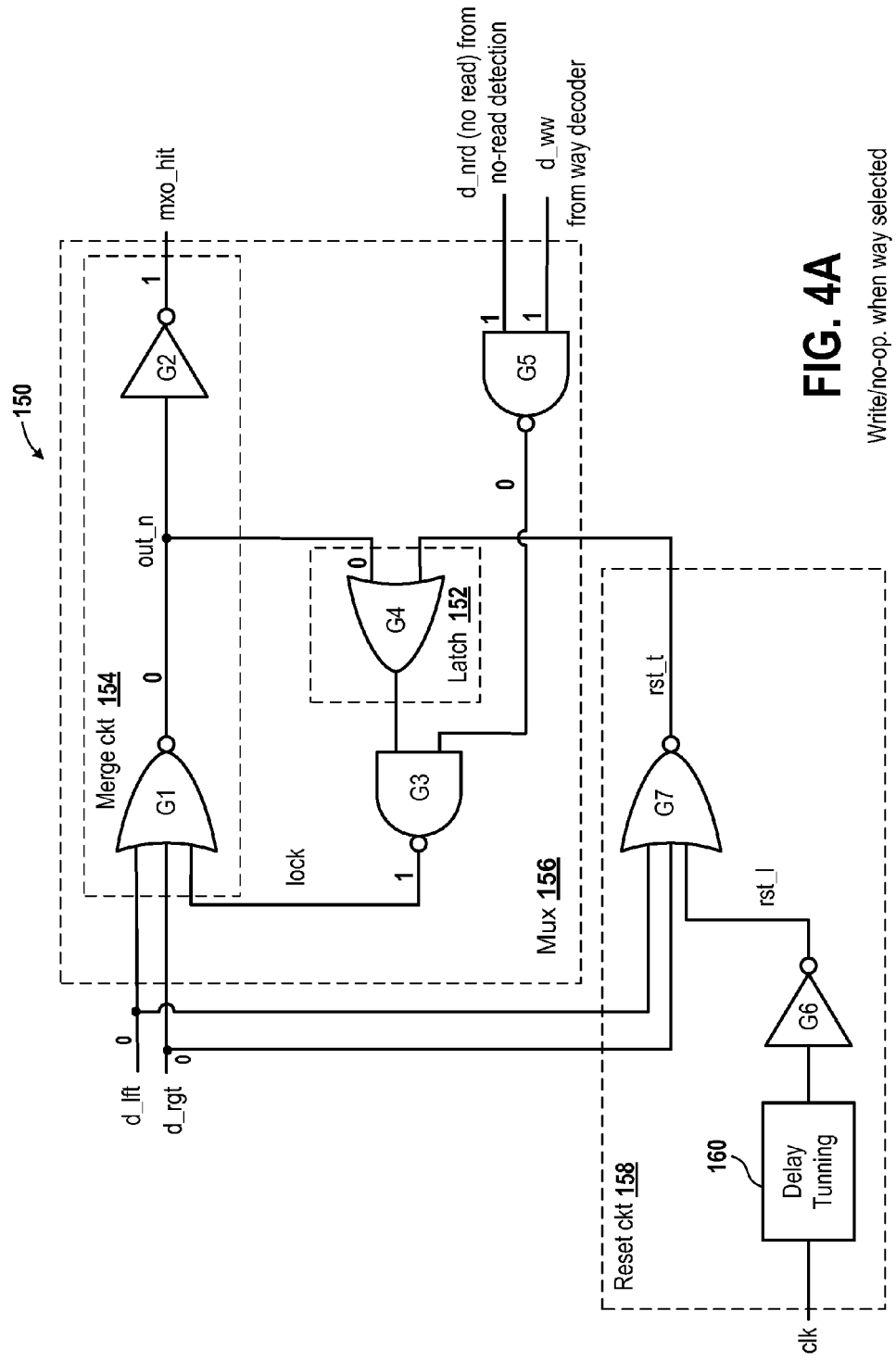
FIG. 4A is a diagram of an embodiment of a merge, multiplex, and latch (MML) circuit of the system of FIG. 1 when a write operation is performed and when a way of the memory array is selected for writing to the way.

FIG. 4A is a diagram of an embodiment of an MML circuit 150, which is an example of any of the MML blocks $116_1$ thru $116_q$ (FIG. 1), when a write operation is performed and when a way, e.g., the way 0, etc., of the memory array 102 (FIG. 1) is selected for writing to the way. In some embodiments, a write operation is a no-operation, e.g., a no read operation, etc.

The MML circuit 150 includes a latch 152, a merge circuit 154, a multiplexer 156, and a reset circuit 158. The merge circuit 154 includes a NOR gate G1 and a NOT gate G2. Also, the reset circuit is coupled to the latch 152. In some embodiments, the MML circuit 150 includes only one latch, e.g., a single latch, etc.

The NOR gate G1 is coupled to the NOT gate G2. The latch 152 includes an OR gate G4. The multiplexer 156 includes the merge circuit 154, a NAND gate G3, the OR gate G4, and a NAND gate G5. The OR gate G4 is an example of the latch 152 and a portion of the multiplexer 156 and is integrated within, e.g., common to, a common component of, etc., the latch 152 and the multiplexer 156. The NOR gate G1 and the NOT gate G2 is an example of the merge circuit 154 and a portion of the multiplexer 156 and is integrated within, e.g., common to, a common component of, etc., the merge circuit 154 and the multiplexer 156. The gates G3 and G5 are coupled with each other.

The reset circuit 158 includes a NOT gate G6 and NOR gate G7. The NOT gate G6 is coupled to the NOR gate G7 and the NOR gate G7 is couple to the OR gate G4. The reset circuit 158 includes a clock delay circuit 160. In some embodiments, the reset circuit 158 excludes the clock delay circuit 160.

The latch 152 is coupled to the merge circuit 154. For example, the OR gate G4 is coupled to the NOR gate G1 and to the NOT gate G2.

During the write operation, the write way signal is active to select the way 0. When the write way signal is active, the signal d_ww output from the decoder 108 (FIG. 1) is also active to indicate a selection of a way to be written to. Moreover, during the write operation, the no-read detect signal d_nrd that is output from the no-read detector 110 (FIG. 1) is active to indicate a lack of a read request, e.g., the read request signal being inactive, etc. The NAND gate G5 provides an inactive signal, e.g., 0, etc., as an output upon receiving the active write way signal d_ww and the active no-read detect signal d_nrd. The NAND gate G3 provides an active signal as an output signal "lock" upon receiving the inactive signal from the output of the NAND gate G5. A signal out_n provided as an output from the NOR gate G1 is inactive upon receiving the active signal from the output of the NAND gate G3. The signal out_n is an example of an inverted outcome. It should be noted that the signals d_lft and d_right are inactive during the write operation. During the write operation, no comparison is performed by the read and compare circuits $112_1$ thru $112_p$ and by the remaining logical stages of comparator block 114 (FIG. 1) to provide the inactive d_lft and d_right signals. An output signal, indicated as mxo_hit, provided by the NOT gate G2 is active upon receiving the inactive signal from the output of the NOR gate G1. The output provided by the NOT gate G2 is received by the receive storage block 118. When the receive storage block 118 (FIG. 1) stores an active signal, e.g., a bit 1, etc., during the write operation, it is determined by the processor coupled to the receive storage block 118 that the write data is written to the way 0 (FIG. 1).

Figure 4B:
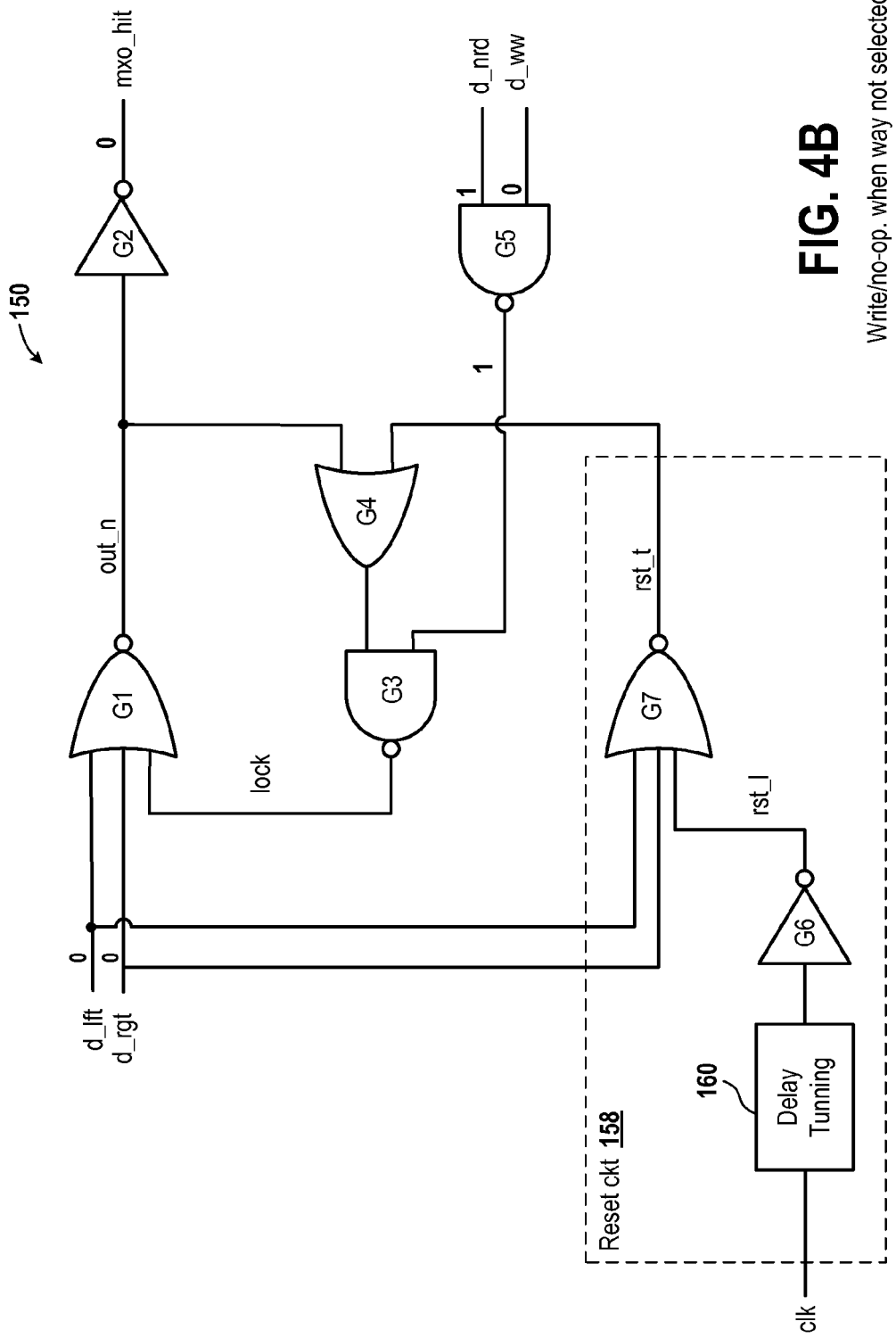
FIG. 4B is a diagram of an embodiment of the MML circuit when a write operation is performed and when the way is not selected for writing to the way.

FIG. 4B is a diagram of an embodiment of the MML circuit 150 when a write operation is performed and when a way, e.g., the way 0, etc., of the memory array 102 (FIG. 1) is not selected for writing to the way. After a cycle of the read operation or the write operation, a reset operation is performed by the reset circuit 158 to reset the output provided by the NOT gate G2 to inactive, e.g., zero, etc. For example, between the read operation and the write operation, the reset operation is performed. In this example, the reset operation is consecutive to the read operation and the write operation is consecutive to the reset operation. As another example, the reset operation is consecutive to the write operation and the read operation is consecutive to the reset operation. As another example, between the write operation and another write operation, the reset operation is performed. In this example, the reset operation is consecutive to the write operation and the other write operation is consecutive to the reset operation. As yet another example, between the read operation and another read operation, the reset operation is performed. In this example, the reset operation is consecutive to the read operation and the other read operation is consecutive to the reset operation. One operation is performed during a clock cycle of the clock signal clk. The reset operation of the circuit 158 is described further below.

During the write operation, when the write way signal is inactive, the way 0 is not selected. When the write way signal is inactive, the signal d_ww output from the decoder 108 (FIG. 1) is also inactive to indicate a lack of selection of a way to be written to. Moreover, during the write operation, the no-read detect signal d_nrd that is output from the no-read detector 110 (FIG. 1) is active to indicate a lack of a read request. The NAND gate G5 provides an active signal, e.g., 1, etc., as an output upon receiving the inactive write way signal d_ww and the active no-read detect signal d_nrd. The active signal output from the NAND gate G5 does not pass through the NAND gate G3 when the NAND gate G3 does not receive an output from the OR gate G4. When the active signal output from the NAND gate G5 does not pass through the NAND gate G3, the output signal mxo_hit provided by the NOT gate G2 stays the same, e.g., inactive, etc., as that during the reset operation and the inactive output signal mxo_hit is provided to the receive storage block 118 (FIG. 1). When the receive storage block 118 (FIG. 1) stores an inactive signal, e.g., a bit 0, etc., during the write operation, it is determined by the processor coupled to the receive storage block 118 that the way 0 is not selected and data is not written to the way 0 (FIG. 1).

When the way 0 of the memory array 102 is selected, the multiplexer 156 allows passage of an indication, e.g., the d_ww signal, etc., of the selection of the array 102 to an output of the NOT gate G2. For example, during the write operation, when the d_ww signal is active, the mxo_hit signal is active. Similarly, when the way 0 of the memory array 102 is not selected, the multiplexer 156 allows passage of an indication, e.g., the d_ww signal, etc., of the lack of selection of the array 102 to an output of the NOT gate G2. For example, during the write operation, when the d_ww signal is inactive, the mxo_hit signal is inactive.

Figure 5A:
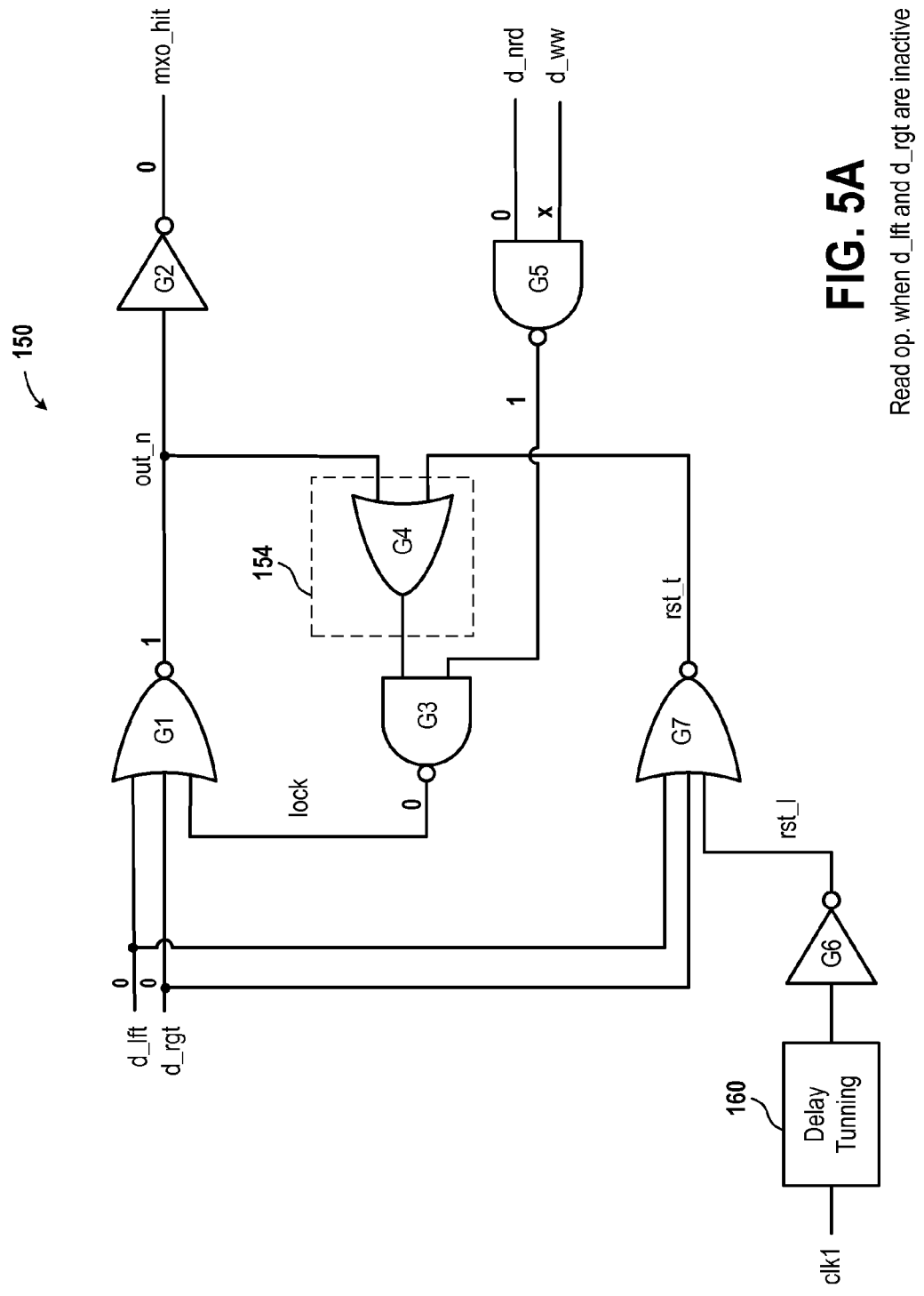
FIG. 5A a diagram of an embodiment of the MML circuit when a read operation is performed, when ways of the memory array are not selected, and when signals received from remaining logical stages of comparator block indicates a lack of a match of bits of a data in signal with higher address memory cells of the way and with lower address memory cells of the way.

FIG. 5A a diagram of an embodiment of the MML circuit 150 when a read operation is performed, and when the ways of the memory array 102 (FIG. 1) are not selected, and when signals received from the remaining logical stages of comparator block 114 (FIG. 1) indicates a lack of a match of bits of the data in signal with the higher address memory cells and with the lower address memory cells of the way 0 (FIG. 1). During the read operation, the write way signal stored in the flip-flop 106B (FIG. 1) is inactive. When the write way signal is inactive, the signal d_ww output from the decoder 108 (FIG. 1) is also inactive to indicate a lack of selection of a way during the read operation. Moreover, during the read operation, the no-read detect signal d_nrd that is output from the no-read detector 110 (FIG. 1) is inactive to indicate reception of a read request by the no-read detector 110 (FIG. 1) from the flip-flop 106C (FIG. 1). The NAND gate G5 provides an active signal, e.g., 1, etc., as an output upon receiving the inactive write way signal d_ww and the inactive no-read detect signal d_nrd. It should be noted that the write way signal d_ww is indicated as a don't care, e.g., "X", signal. When the no-read detect signal d_nrd is inactive, it does not matter what the write way signal d_ww is.

Moreover, as described above, between two consecutive read cycles, or two consecutive write cycles, or between a read cycle and a write cycle consecutive to the read cycle, or between a read cycle that is consecutive to the write cycle, the reset operation is performed. During the reset operation, the signal out_n that is provided as an output from the NOR gate G1 is active and a reset signal rst_t that is output from the NOR gate G7 is also active. When the read operation is performed after the reset operation, the signals out_n and rst_t have the active values, which are the same as that during the reset operation. The latch 152 latches a value, e.g., active, etc., of the out_n signal generated during the reset operation to provide the value during the read operation to the NAND gate G3. An output of the NOR gate G4 is an active signal when signals input to the NOR gate G4 are active. Moreover, the lock signal that is output from the NAND gate G3 is inactive when the NAND gate G3 receives active signals as inputs from the OR gate G4 and the NAND gate G5.

When there is a lack of match between the higher address memory cells of the memory array 102 and the bits of the data in signal, and there is a lack of match between the lower address memory cells of the memory array 102 and bits of the data in signal, and the lock signal is inactive, the NOR gate G1 provides the signal out_n as active. The NOT gate G2 receives the active out_n signal to provide an inactive signal as the mxo_hit signal. During the read operation, when none of the bits stored in the way 0 match that in the data in signal, the signal mxo_hit is inactive.

Figure 5B:
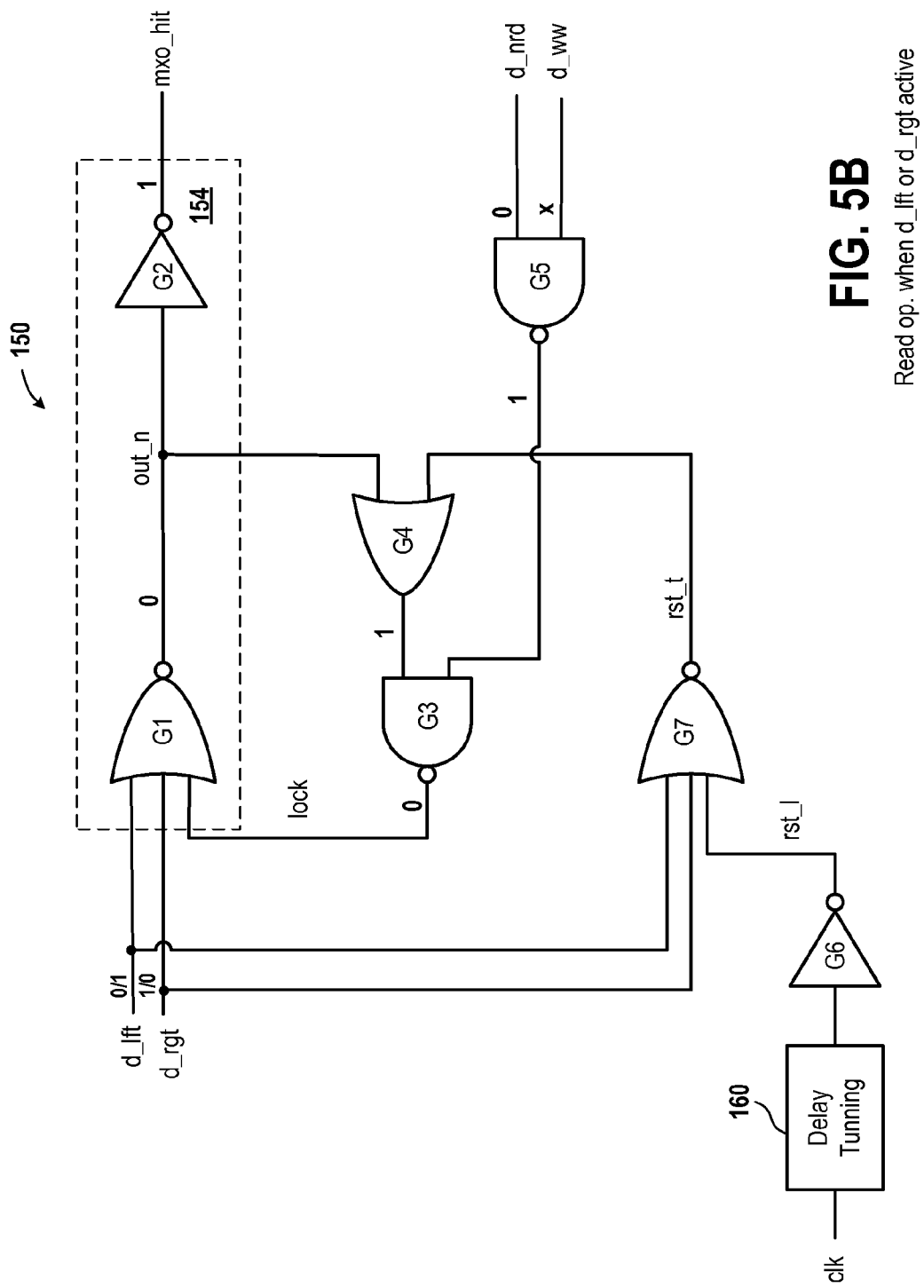
FIG. 5B a diagram of an embodiment of the MML circuit when the read operation is performed, when the ways of the memory array are not selected, and when signals received from the remaining logical stages of comparator block indicates a match of bits of the data in signal with the higher address memory cells or with the lower address memory cells of the memory array.

FIG. 5B a diagram of an embodiment of the MML circuit 150 when a read operation is performed, and when the ways of the memory array 102 (FIG. 1) are not selected, and when signals received from the remaining logical stages of comparator block 114 (FIG. 1) indicates a match of bits of the data in signal with the higher address memory cells or with the lower address memory cells of the way 0 (FIG. 1). As described above with reference to FIG. 5A, during the read operation, the NAND gate G5 provides an active signal, e.g., 1, etc., as an output upon receiving the inactive write way signal d_ww and the inactive no-read detect signal d_nrd.

Moreover, as described above, during the reset operation, an output of the NOR gate G4 is an active signal when signals input to the NOR gate G4 are active. Moreover, the lock signal that is output from the NAND gate G3 is inactive when the NAND gate G3 receives active signals as inputs from the OR gate G4 and the NAND gate G5.

When there is a match between the higher address memory cells of the memory array 102 and the bits of the data in signal or there is a match between the lower address memory cells of the memory array 102 and bits of the data in signal, and the lock signal is inactive, the NOR gate G1 provides the signal out_n as inactive. As shown, when there is match between the higher address memory cells and the bits of the data in signal, the signal d_lft is active, e.g., 1, etc., and the signal d_rgt is inactive, e.g., 0, etc. Moreover, as shown, when there is match between the lower address memory cells and the bits of the data in signal, the signal d_rgt is active, e.g., 1, etc., and the signal d_lft is inactive, e.g., 0, etc. The NOT gate G2 receives the inactive out_n signal to provide an active signal as the mxo_hit signal. During the read operation, when the bits stored in the way 0 match that in the data in signal, e.g., the bits in the higher address memory cells or the bits in the lower address memory cells match the bits of the data in signal, the signal mxo_hit is active.

It should be noted that when the lock signal is inactive, the merge circuit 154 (FIG. 4A), which includes the NOR gate G1 and the NOT gate G2, merges, e.g., performs a logic OR operation on, the d_lft and the d_rgt signals to generate the merged outcome of comparison. The merged outcome is indicated as the mxo_hit signal.

As illustrated in FIGS. 5A and 5B, during the read operation, e.g., when the d_nrd signal is inactive, etc., the multiplexer 156 allows passage of the merged outcome of comparison, e.g., the mxo_hit signal, etc., to the receive storage block 118 (FIG. 1).

Figure 6:
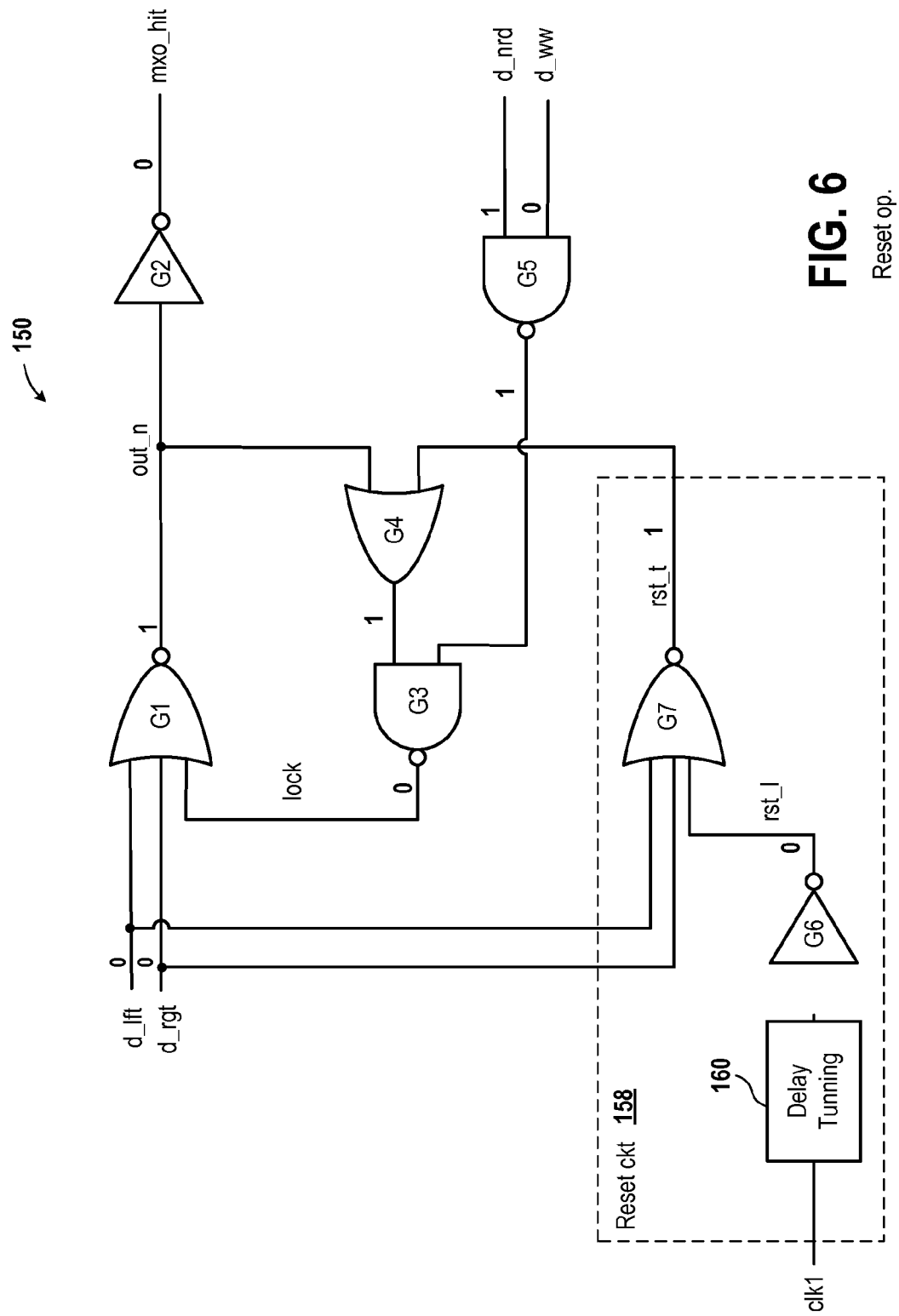
FIG. 6 is a diagram of an embodiment of the MML circuit to illustrate a reset operation for resetting the MML circuit.

FIG. 6 is a diagram of an embodiment of the MML circuit 150 to illustrate the reset operation. During the reset operation, the clock signal clk becomes active. The clock signal clk is delayed by the clock delay circuit 160. When the active delayed clock signal clk is provided by the clock delay circuit 160 to the NOT gate G6, the NOT gate G6 provides an inactive rst_1 signal. Moreover, during the reset operation, there is no comparison performed by the read and compare circuits 1121 thru 112p and the remaining logical stages of comparator block 114 (FIG. 1). Where there is no comparison performed, the d_lft and d_rgt signals are inactive, e.g., 0, etc. Upon receiving inactive signals at its three inputs, the NOR gate G7 provides an active signal as the reset signal rst_t.

Moreover, during the reset operation, the write way signal d_ww is inactive and the d_nrd signal is active. Neither the write operation nor the read operation is performed during the reset operation. Upon receiving inactive d_ww signal at its input, the NAND gate G5 provides an active signal at its output. Upon receiving the active rst_t signal, the OR gate G4 provides an active signal at its output.

Furthermore, upon receiving active signals at its inputs, the NAND gate G3 provides an inactive signal as the lock signal at its output. Upon receiving the inactive signals at all of its three inputs, the NOR gate G1 provides an active signal as the out_n signal. When the active signal is received as the out_n signal, the NOT gate G2 provides an inactive signal as the mxo_hit signal.

During the reset operation, when the read operation is to be performed, e.g., when the d_nrd signal is inactive and the d_ww signal is inactive, etc., the rst_t signal is changed to inactive. Upon receiving inactive signals at both its inputs, the NAND gate G5 provides an active signal at its output. Also, an input of the OR gate G4 receives the active out_n signal, which is generated during the reset operation, to provide an active signal as an output. Another input of the OR gate G4 receives the inactive reset signal rst_t to provide an active signal at its output. Upon receiving the active signals at both its inputs, the NOT gate G3 provides an inactive signal as the lock signal. When the lock signal is inactive, a result of an OR operation of the d_lft and d_right signals is provided as the mxo_hit signal via the NOT gate G1 and the NOT gate G2.

Similarly, during the reset operation, when the write operation is to be performed and the way 0 is selected, e.g., when the d_nrd signal is active and the d_ww signal is active, etc., the rst_t signal is changed to inactive. Upon receiving active signals at both its inputs, the NAND gate G5 provides an inactive signal at its output. Upon receiving the inactive signal from the NAND gate G5 at its input, the NAND gate G3 provides an active signal as the lock signal. The mxo_hit signal is active when the lock signal is active.

Also, during the reset operation, when the write operation is to be performed and the way 0 is not selected, e.g., when the d_nrd signal is active and the d_ww signal is inactive, etc., the rst_t signal is changed to inactive. Upon receiving the inactive d_ww signal at its input, the NAND gate G5 provides an active signal at its output. As explained above, when the write operation is to be performed and the way 0 is not selected, the active signal received from the NAND gate G5 does not pass through the NAND gate G3 and the mxo_hit signal is inactive.

In some embodiments, the reset circuit 158 resets the merged outcome, e.g., the signal mxo_hit. For example, when the out_n signal is inactive and the mxo_hit signal is active and the rst_t signal becomes active, e.g., in a reset mode, etc., from being inactive, an output provided by the NOR gate G4 is active. During the reset operation, an output provided by the NAND gate G5 is active. When the NAND gate G3 receives the active outputs from the gates G4 and G5 during the reset operation, the NAND gate G3 provides the lock signal as an inactive signal. The NOR gate G1 provides an active signal as the out_n signal upon receiving inactive signals at all of its inputs. The NOT gate G2 provides the mxo_hit signal as an inactive signal upon receiving the active out_n signal. The reset circuit 158 resets the merged outcome from being active to being inactive.

Figure 7:
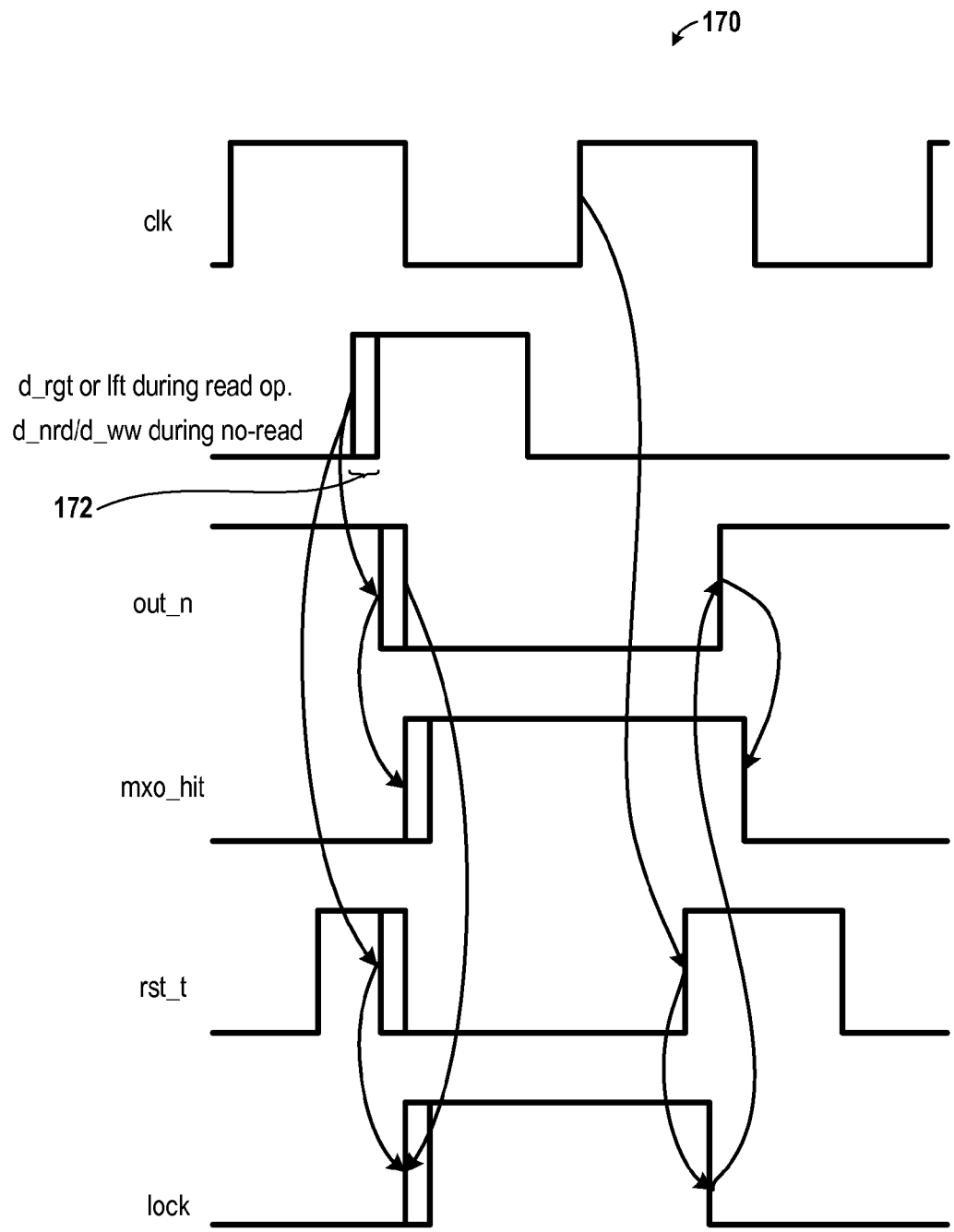
FIG. 7 is an embodiment of a timing diagram that illustrates an operation of the MML circuit.

FIG. 7 is an embodiment of a timing diagram 170 that illustrates an operation of the MML circuit 150 (FIGS. 4A, 4B, 5A, 5B, 6). The reset signal rst_t becomes active during the reset operation. During the reset operation, when the d_rgt or d_lft signal becomes active, e.g., high, one, etc., to indicate that the read operation is occurring, the reset signal rst_t becomes inactive. For example, the reset signal rst_t signal (FIG. 6) is changed from active to inactive. The read operation is performed synchronous with, e.g., after, etc., a rising edge of the clock signal. In some embodiments, the read operation is performed synchronous with, e.g., after, etc., a falling edge of the clock signal.

When the d_rgt or d_lft signal becomes active during the read operation, as explained above with reference to FIG. 5A, the signal out_n becomes inactive and the signal mxo_hit becomes active. Also, when the reset signal rst_t signal becomes inactive and the out_n signal becomes inactive, the lock signal becomes active.

During the reset operation, when the d_nrd or d_ww signal becomes active, e.g., high, one, etc., to indicate that the write operation is occurring, the reset signal rst_t becomes inactive. The write operation is performed synchronous with, e.g., after, etc., a rising edge of the clock signal. In some embodiments, the write operation is performed synchronous with, e.g., after, etc., a falling edge of the clock signal.

When the d_nrd or d_ww signal becomes active during the write operation, as explained above with reference to FIG. 4A, the signal out_n becomes inactive and the signal mxo_hit becomes active. Also, as shown in FIG. 7, when the reset signal rst_t signal becomes inactive and the out_n signal becomes inactive, the lock signal becomes active.

It should be noted that the memory array 102 (FIG. 1) has properties that add a delay 172 as to when the d_lft or d_rgt signal becomes active from inactive. The d_lft and d_rgt signals are generated based on data stored in the memory array 102. For example, when there is a match between bits of the data in signal and bits stored within the lower address memory cells of the way 0, the remaining logical stages of the comparator block 114 (FIG. 1) generates the d_rgt signal as an active signal. As another example, when there is a match between bits of the data in signal and bits stored within the higher address memory cells of the way 0, the remaining logical stages of the comparator block 114 (FIG. 1) generates the d_lft signal as an active signal.

Some examples of the properties of the memory array 102 include properties of semiconductor materials of the memory array 102. The delay 172 is propagated through the out_n, mxo_hit, rst_t, and lock signals. For example, the delay 172 occurs when the out_n signal switches from being active to being inactive, and the delay 172 occurs when the mxo_hit signal switches from being inactive to being active, and the delay 172 occurs when the reset signal rst_t switches from being active to being inactive, and the delay 172 occurs when the lock signal switches from being inactive to being active.

When the clock signal becomes active during a clock cycle, the rst_t signal becomes active as explained above with reference to FIG. 6. Further, as explained above with reference to FIG. 6, when the rst_t signal becomes active, the lock signal becomes inactive and the out_n signal becomes active. When the out_n signal becomes active, the mxo_hit signal becomes inactive.

As shown in FIG. 7, a rising edge of the mxo_hit signal may have the delay 172 and a falling edge of the mxo_hit signal lacks a delay. A rising edge, e.g., change from being inactive to being active, etc., of the rst_t signal is not based on data stored within the memory array 102 (FIG. 1). For example, during the rising edge of the clock signal clk, the reset signal rst_t becomes active. The clock signal is not received or generated based on data stored within the memory array 102. The properties of the memory array 102 do not affect the rising edge of the rst_t signal and the falling edge of the mxo_hit signal. During the reset operation, the falling edge of the mxo_hit signal is generated based on the rising edge of the rst_t signal as explained above with reference to FIG. 7.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those implementing physical manipulation of physical quantities. Any of the operations described herein that form part of the embodiments are useful machine operations. The embodiments also relates to a device or an apparatus for performing these operations. The apparatus may be specially constructed for a purpose, such as a special purpose computer. When defined as the special purpose computer, the computer can also perform other processing, program execution or routines that are not part of the special purpose, while still being capable of operating for the special purpose. Alternatively, the operations may be processed by a computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer-readable code on a non-transitory computer-readable medium. The non-transitory computer-readable medium is any data storage device that can store data, which can be thereafter be read by a computer system. Examples of the non-transitory computer-readable medium include hard drives, network attached storage (NAS), read-only memory, random-access memory, CD-ROMs, CD-Rs, CD-RWs, magnetic tapes and other optical and non-optical data storage devices. The non-transitory computer-readable medium can include computer-readable tangible medium distributed over a network-coupled computer system so that the computer-readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A system comprising:
a memory array including a way, the way including lower address memory cells for storing data and including higher address memory cells for storing data, the lower address memory cells having lower addresses compared to addresses of the higher address memory cells;
a read and compare circuit coupled to the memory array, the read and compare circuit for performing a read operation, the read operation including reading the data stored within the lower address memory cells and for reading the data stored within the higher address memory cells, the read and compare circuit for comparing the data stored within the lower address memory cells with information received from a storage device to generate a result of comparison, the read and compare circuit for comparing the data stored within the higher address memory cells with the information to generate a result of comparison; and
a merge and multiplex circuit coupled to the read and compare circuit, the merge and multiplex circuit for merging the result of comparison generated based on the comparison with the lower address memory cells and the result of comparison generated based on the comparison with the higher address memory cells to create a merged outcome of comparison, the merged outcome of comparison indicating whether the way has bits that match the information, the merge and multiplex circuit for selecting between providing the merged outcome of comparison during the read operation as an output and providing an indication of a selection of the way during a write operation as an output.

2. The system of claim 1, wherein the read and compare circuit is a pass-through circuit.

3. The system of claim 1, further comprising wherein the storage device includes a flip-flop, the flip-flop coupled to the read and compare circuit.

4. The system of claim 1, further comprising:
a flip-flop for storing the indication of the selection of the way; and
a decoder coupled to the flip-flop and directly coupled to the merge and multiplex circuit, the decoder for decoding the indication of the selection and providing the decoded indication to the merge and multiplex circuit.

5. The system of claim 1, further comprising:
a flip-flop for storing a signal indicating whether the read operation is to be performed; and
a detector coupled to the flip-flop, the detector for receiving the signal from the flip-flop to generate a detect signal, the detect signal indicating whether the read operation is to be performed, the detector connected to the merge and multiplex circuit for providing the detect signal to the merge and multiplex circuit, the merge and multiplex circuit allowing passage of the merged outcome of comparison upon receiving the detect signal indicating that the read operation is to be performed, the merge and multiplex circuit allowing passage of the indication of the selection of the way upon receiving the detect signal indicating that the read operation is not to be performed.

6. The system of claim 5, wherein the detector is directly coupled to the merge and multiplex circuit.

7. The system of claim 1, wherein the merge and multiplex circuit includes a single latch.

8. The system of claim 1, further comprising a receive storage block, wherein the merge and multiplex circuit is coupled with the receive storage block.

* * * * *

UNITED STATES PATENT AND TRADEMARK OFFICE
CERTIFICATE OF CORRECTION

PATENT NO.        : 9,171,591 B2                                  Page 1 of 1
APPLICATION NO.   : 13/905057
DATED             : October 27, 2015
INVENTOR(S)       : Lee et al.

It is certified that error appears in the above-identified patent and that said Letters Patent is hereby corrected as shown below:

In the Specification

In column 5, line 12, delete "$116_8$." and insert -- $116_q$. --, therefor.

Signed and Sealed this
Twenty-eighth Day of June, 2016

Michelle K. Lee
*Director of the United States Patent and Trademark Office*